(12) United States Patent
Chen et al.

(10) Patent No.: US 11,749,657 B2
(45) Date of Patent: Sep. 5, 2023

(54) FAN-OUT PACKAGING STRUCTURE AND METHOD

(71) Applicant: SJ Semiconductor (Jiangyin) Corporation, Jiangyin (CN)

(72) Inventors: Yenheng Chen, Jiangyin (CN); Chengchung Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 150 days.

(21) Appl. No.: 17/476,291

(22) Filed: Sep. 15, 2021

(65) Prior Publication Data

US 2022/0084996 A1    Mar. 17, 2022

(30) Foreign Application Priority Data

Sep. 15, 2020  (CN) .......................... 202010967386.9
Sep. 15, 2020  (CN) .......................... 202022016090.7

(51) Int. Cl.
*H01L 25/16*    (2023.01)
*H01L 23/00*    (2006.01)

(52) U.S. Cl.
CPC ............. *H01L 25/16* (2013.01); *H01L 24/19* (2013.01); *H01L 24/20* (2013.01); *H01L 24/24* (2013.01); *H01L 24/73* (2013.01); *H01L 2224/2201* (2013.01); *H01L 2224/221* (2013.01); *H01L 2224/244* (2013.01); *H01L 2224/24145* (2013.01); *H01L 2224/24265* (2013.01); *H01L 2224/73204* (2013.01);
(Continued)

(58) Field of Classification Search
CPC ......... H01L 25/16; H01L 24/19; H01L 24/20;
H01L 24/24; H01L 24/73; H01L
2224/2201; H01L 2224/221; H01L
2224/24145; H01L 2224/24265; H01L
2224/244; H01L 2224/73204; H01L
2224/73209; H01L 2224/73217; H01L
2224/73259
See application file for complete search history.

(56) References Cited

U.S. PATENT DOCUMENTS

2021/0090993 A1*  3/2021  Yu ..................... H01L 23/5226
2021/0090995 A1*  3/2021  Kuo ................... H01L 25/0657
2021/0351145 A1*  11/2021 Patil ...................... H01L 24/19

* cited by examiner

*Primary Examiner* — Fernando L Toledo
*Assistant Examiner* — Neil R Prasad
(74) *Attorney, Agent, or Firm* — Alston & Bird LLP

(57) ABSTRACT

The present disclosure provides a fan-out chip packaging structure and a method to fabricate the fan-out chip package. The fan-out chip packaging structure includes a first redistribution layer, a second redistribution layer, metal connecting posts, a semiconductor chip, a first packaging layer, a stacked chip package, a passive element, a filling layer, a metal bumps, and a second packaging layer. By means of the present disclosure, various chips having different functions can be integrated into one package structure, thereby improving the integration level of the fan-out packaging structure. By means of the first redistribution layer, the second redistribution layer, and the metal connecting posts, a three-dimensional vertically stacked package is achieved. In this way, the integration level of the packaging structure can be effectively improved, and the conduction path can be effectively shortened, thereby reducing power consumption, increasing the transmission speed, and increasing the data processing capacity.

10 Claims, 6 Drawing Sheets

(52) U.S. Cl.
CPC ............... *H01L 2224/73209* (2013.01); *H01L 2224/73217* (2013.01); *H01L 2224/73259* (2013.01)

FAN-OUT PACKAGING STRUCTURE AND METHOD

CROSS REFERENCE TO RELATED APPLICATION

The present application claims the benefit of priority to Chinese Patent Application No. CN 2020109673869, entitled "FAN-OUT PACKAGING STRUCTURE AND METHOD", and Chinese Patent Application No. CN 2020220160907, entitled "FAN-OUT PACKAGING STRUCTURE", both filed with CNIPA on Sep. 15, 2020, the disclosures of which are incorporated herein by reference in their entirety for all purposes.

FIELD OF TECHNOLOGY

The present disclosure generally relates to semiconductor packaging technology, and in particular, to a fan-out packaging structure and method.

BACKGROUND

A more reliable and faster circuit having a higher density and lower cost is the goal of integrated circuit packaging technology. With the advent of the era of 5G communications and artificial intelligence, the amount of data to be transmitted and interactively processed by chips is even larger, and the demands generated by the mobile Internet and the Internet of Things (IoT) are increasingly stronger. Therefore, miniaturization and multi-functionalization of electronic terminal products are trending in the industry. How to integrate and package a plurality of high-density chips of different types to form a powerful system, which consumes low power, has become a major challenge in the field of advanced semiconductor chip packaging technology.

Fan-out wafer level packaging (FOWLP) has become an advanced competitive method for fan-out packaging because it has more input/output ports (I/O) and better integration flexibility. However, among the existing fan-out packaging techniques, packages tend to take relatively large areas and show bulky thickness due to limited distribution accuracy, so such packaging techniques result in numerous problems such as cumbersome processes and low reliability.

Therefore, it is necessary to provide a fan-out packaging fan-out packaging structure and method that solve the above problems.

SUMMARY

The present disclosure provides a fan-out packaging method, comprising the following steps:
providing a support substrate, and forming a separation layer on the support substrate;
forming a first redistribution layer on the separation layer, where the first redistribution layer comprises a first surface in contact with the separation layer and a second surface opposite to the first surface;
forming metal connecting posts on the second surface of the first redistribution layer, where the metal connecting posts are electrically connected to the first redistribution layer;
providing a semiconductor chip, where the semiconductor chip is located on the second surface of the first redistribution layer, a back side of the semiconductor chip is bonded to the first redistribution layer, and a front side of the semiconductor chip is away from the second surface of the first redistribution layer;
packaging the first redistribution layer, the metal connecting posts, and the semiconductor chip by a first packaging layer, where the metal connecting posts and a pad of the semiconductor chip are exposed from the first packaging layer;
forming a second redistribution layer on the first packaging layer, where the second redistribution layer comprises a first surface in contact with the first packaging layer and a second surface opposite to the first surface, and the second redistribution layer is electrically connected to the metal connecting posts and the pad of the semiconductor chip;
forming metal bumps on the second surface of the second redistribution layer, where the metal bumps is electrically connected to the second redistribution layer; providing a carrier, and peeling off the support substrate to expose the first surface of the first redistribution layer;
performing laser etching on the first redistribution layer to expose a metal distribution layer in the first redistribution layer;
providing a stacked chip package and a passive element, wherein the stacked chip package and the passive element are located on the first surface of the first redistribution layer, and are both electrically connected to the metal distribution layer exposed from the first redistribution layer;
filling a gap between the stacked chip package and the first redistribution layer with a filling layer; and
performing cutting to form a fan-out packaging structure.

Optionally, after forming a filling layer and before performing cutting, the method further comprises a step of packaging the first redistribution layer, the stacked chip package, and the passive element by a second packaging layer. The second packaging layer comprises plastics.

Optionally, the stacked chip package comprises an Embedded Package on Package (ePoP) memory.

Optionally, the passive element comprises one or more of a resistor, a capacitor, and an inductor.

The present disclosure further provides a fan-out packaging structure. The fan-out packaging structure comprises:
a first redistribution layer, comprising a first surface and a second surface opposite to each other;
a second redistribution layer, comprising a first surface and a second surface opposite to each other; metal connecting posts, located between the second surface of the first redistribution layer and the first surface of the second redistribution layer and electrically connected to the first redistribution layer and the second redistribution layer;
a semiconductor chip, located between the second surface of the first redistribution layer and the first surface of the second redistribution layer, where a back side of the semiconductor chip is bonded to the first redistribution layer, and a front side of the semiconductor chip is away from the first redistribution layer and electrically connected to the second redistribution layer;
a first packaging layer, located between the second surface of the first redistribution layer and the first surface of the second redistribution layer and configured to cover the first redistribution layer, the metal connecting posts, and the semiconductor chip;
a stacked chip package and a passive element, located on the first surface of the first redistribution layer and electrically connected to the first redistribution layer;
a filling layer, located between the stacked chip package and the first redistribution layer and configured to fill a gap between the stacked chip package and the first redistribution layer; and
metal bumps, located on the second surface of the second redistribution layer and electrically connected to the second redistribution layer.

Optionally, the fan-out packaging structure further comprises a second packaging layer, configured to cover the first redistribution layer, the stacked chip package, and the passive element. The second packaging layer comprises plastics.

Optionally, the stacked chip package comprises an ePoP memory.

Optionally, the passive element comprises one or more of a resistor, a capacitor, and an inductor.

Optionally, a thickness of the second redistribution layer is greater than a thickness of the first redistribution layer.

Optionally, the first packaging layer comprises one of an epoxy resin layer, a polyimide layer, and a silica gel layer. The filling layer comprises one of the epoxy resin layer, the polyimide layer, and the silica gel layer.

As described above, by means of the fan-out packaging structure and the fan-out packaging method disclosed with the present disclosure, various chips having different functions can be integrated into one packaging structure, thereby improving the integration level of the fan-out packaging structure. By means of the first redistribution layer, the second redistribution layer, and the metal connecting posts, three-dimensional vertical stacked packaging is achieved. In this way, the integration level of the packaging structure can be effectively improved, and the conduction paths can be effectively shortened, thereby reducing power consumption of the subsequently prepared device, increasing the transmission speed, and increasing the data processing capacity of the device.

BRIEF DESCRIPTION OF THE DRAWINGS

FIG. 16 and FIG. 18 are also schematic structural diagrams of two different fan-out packaging structures according to the present disclosure.

DETAILED DESCRIPTION

Figure 1:
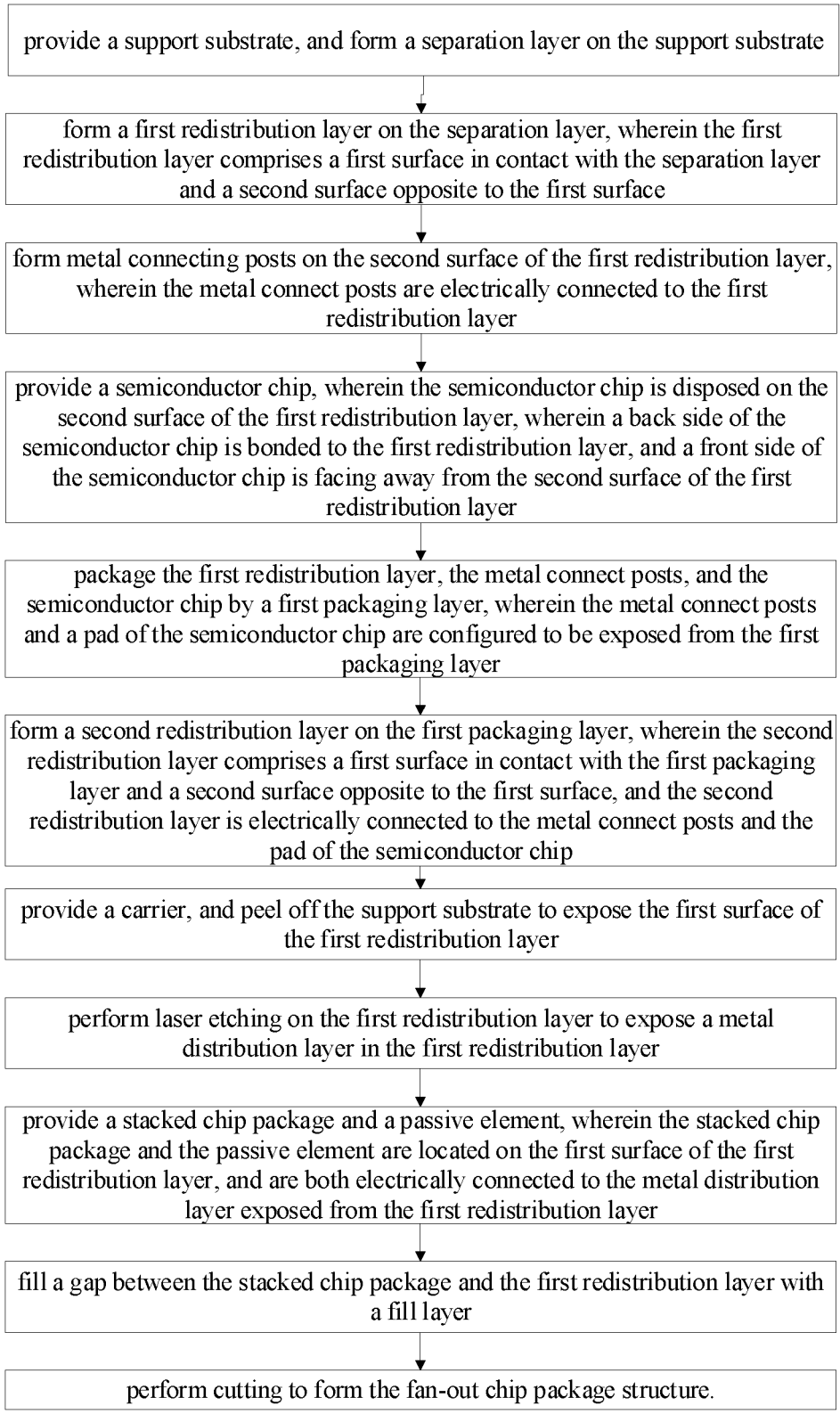
FIG. 1 is a flowchart showing process steps of preparing a fan-out packaging structure according to the present disclosure.

The implementations of the present disclosure are described below through specific examples. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

For example, when describing the embodiments of the present disclosure in detail, for ease of description, a cross-sectional view for showing a device structure is partially enlarged not necessarily to scale, and the schematic diagram is merely an example and is not intended to limit the scope of the present disclosure.

For ease of description, spatial terms, such as "under", "below", "lower", "beneath", "above", "upper", and the like, may be used herein to describe the relationship between one element or feature and another element or feature as shown in the accompanying drawings. It is to be understood that these spatial terms are intended to encompass other directions of the device in use or operation than the directions depicted in the accompanying drawings. In addition, when a layer is referred to as being "between" two layers, the layer may be the only layer between the two layers, or one or more layers may be present therebetween. As used herein, "between . . . and . . . " means that two endpoint values are included.

In the context of this application, a structure in which a first feature is described as being "on" a second feature may include an embodiment in which the first feature and the second feature are in direct contact with each other, or may include an embodiment in which there is another feature formed between the first feature and the second feature. In other words, the first feature and the second feature may not be in direct contact with each other.

It should be noted that, the drawings provided in this embodiment only exemplify the basic idea of the present disclosure. Although only the components related to the present disclosure are shown in the drawings, and are not drawn according to the quantities, shapes, and sizes of the components during actual implementation. During actual implementation, the patterns, quantities, and proportions of the components may be changed as needed, and the layout of the components may be more complicated.

As shown in FIG. 1, the present disclosure provides a fan-out packaging method, by which various chips having different functions can be integrated into one fan-out packaging structure, thereby improving the integration level of the overall system. By means of the first redistribution layer, the second redistribution layer, and the metal connecting posts, a three-dimensional vertically stacked packaging is achieved. In this way, the integration level of the packaging structure can be effectively improved, and the conduction paths can be significantly shortened, thereby the power consumption of the subsequently prepared devices is reduced, increasing the transmission speed, and increasing the data processing capacity of the device.

Figure 2:
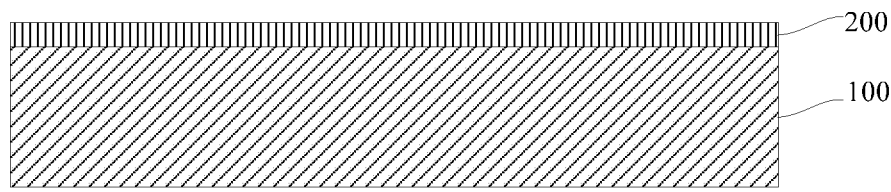
FIG. 2 to FIG. 18 are schematic diagrams showing intermediate structures obtained after various steps of preparing a fan-out packaging structure according to the present disclosure present disclosure, where

First, referring to FIG. 2, a support substrate 100 is provided, and a separation layer 200 is formed on the support substrate 100.

As an example, the support substrate 100 may comprise one of a glass substrate, a metal substrate, a semiconductor substrate, a polymer substrate, and a ceramic substrate. In this embodiment, the support substrate 100 is preferably a glass substrate, which costs less. It is also easy to form the separation layer 200 on a glass substrate, and using a glass substrate as the support substrate 100 can ease the subsequent peeling process. The separation layer 200 may comprise one of an adhesive tape and a polymer layer. When a polymer layer is used, the surface of the support substrate 100 may be coated with polymer by a spin coating process, and then may be cured and shaped by an ultraviolet curing or heat curing process. In this embodiment, the separation layer 200 adopts a light-to-heat conversion (LTHC) layer, so that the LTHC layer can be heated by a laser in subsequent steps. In this way, the support substrate 100 can be separated from the LTHC layer, thereby rendering the peeling process easier and reducing damages.

Figure 3:
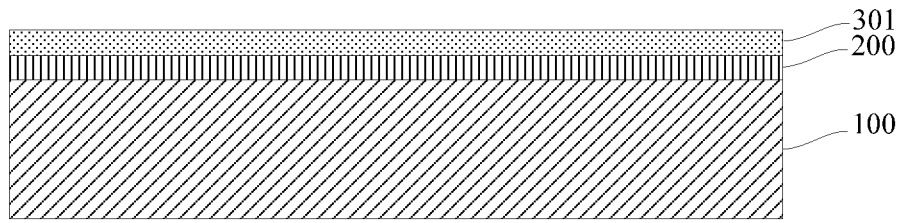
Figure 4:
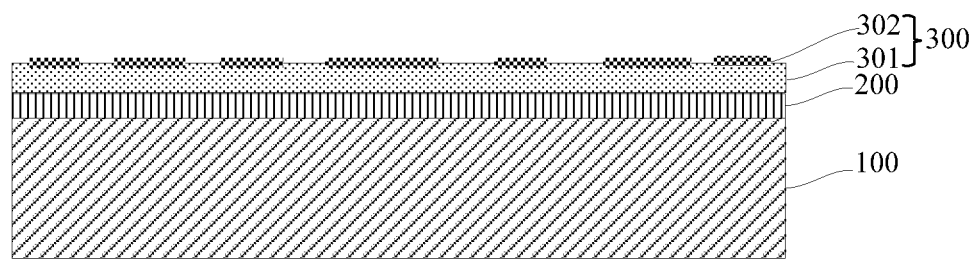

Next, referring to FIG. 3 and FIG. 4, a first redistribution layer 300 is formed on the separation layer 200. The first redistribution layer 300 comprises a first surface in contact with the separation layer 200 and a second surface opposite to the first surface.

As an example, in some embodiment, a dielectric layer 301 is first formed on a surface of the separation layer 200, and then a patterned metal distribution layer 302 is formed. In addition, the step of forming the dielectric layer 301 and the metal distribution layer 302 can be repeated according to process requirements, so as to form more conductive channels. In some embodiment, there is only one dielectric layer 301 and one metal distribution layer 302, and the thickness of the first redistribution layer 300 is thereby reduced. However, the specific number of layers of the first redistribution layer 300 can be selected as required. A material of the dielectric layer 301 may comprise one of epoxy resin, silica gel, polyimides, polyimides, benzocyclobutene, silicon oxide, phosphosilicate glass, and fluorine-containing glass. A material of the metal distribution layer 302 may comprise one of copper, aluminum, nickel, gold, silver, and titanium.

Figure 5:
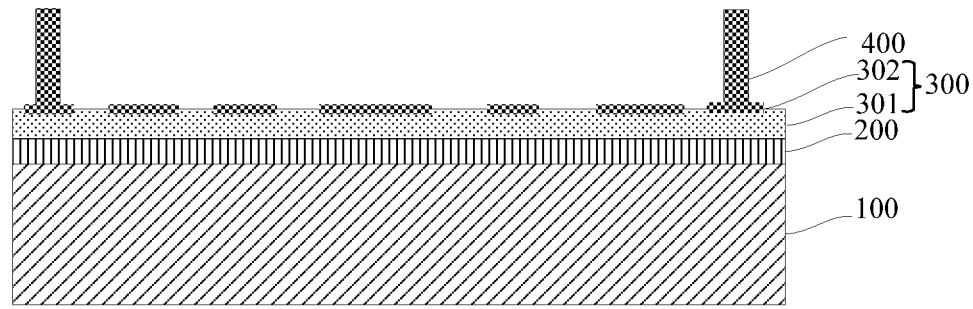

Next, referring to FIG. 5, metal connecting posts 400 are formed on the second surface of the first redistribution layer 300. The metal connecting posts 400 are electrically connected to the first redistribution layer 300.

As an example, the metal connecting posts 400 may be formed by a wire bonding process. The wire bonding process may comprise one of a thermo-compression wire bonding process, an ultrasonic wire bonding process, and a thermo-compression ultrasonic wire bonding process. A material of the metal connecting posts 400 may comprise one or more of Au, Ag, Cu, and Al. The method for forming the metal connecting posts 400 and the selection of the material are not excessively limited herein.

Figure 6:
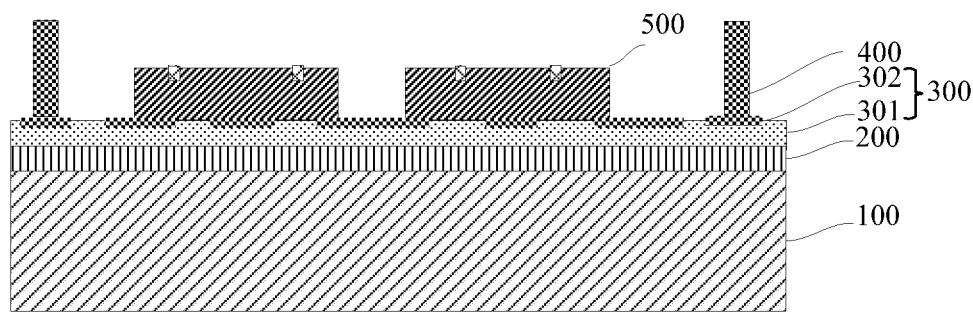

Next, referring to FIG. 6, a semiconductor chip 500 is provided. The semiconductor chip 500 is placed on the second surface of the first redistribution layer 300. A back side of the semiconductor chip 500 is bonded to the first redistribution layer 300. A front side of the semiconductor chip 500 is facing away from the second surface of the first redistribution layer 300.

As an example, a height of one of the metal connecting posts 400 is greater than a thickness of the semiconductor chip 500.

As an example, when the height of one of the metal connecting posts 400 is greater than the thickness of the semiconductor chip 500, so the semiconductor chip 500 is protected and any damage to it can be reduced in the subsequent thinning process. The detailed heights of the metal connecting posts 400 and the thickness of the semiconductor chip 500 may be set depending on the type of the semiconductor chip 500, which is not excessively limited herein.

Figure 7:
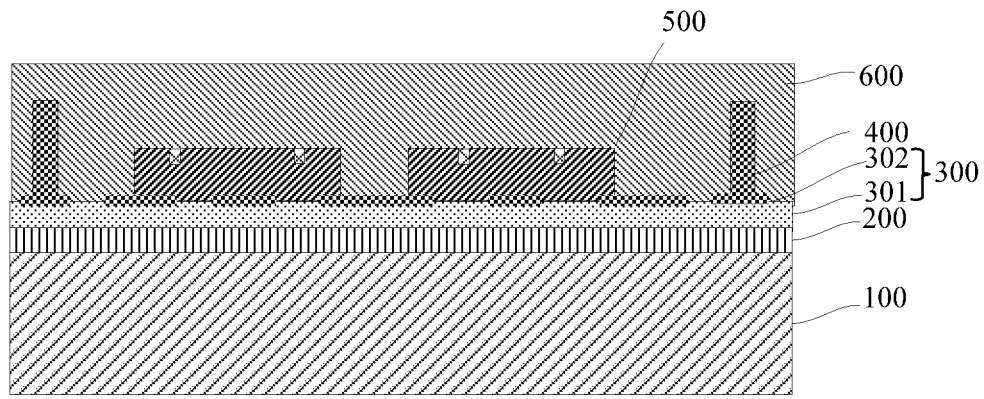
Figure 8:
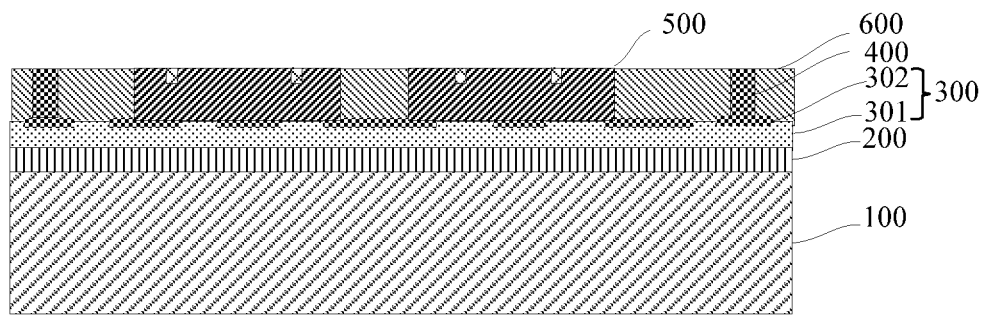

Next, referring to FIG. 7 and FIG. 8, the first redistribution layer 300, the metal connecting posts 400, and the semiconductor chip 500 are packaged by a first packaging layer 600. The metal connecting posts 400 and a pad on the front side of the semiconductor chip 500 are configured to be exposed from the first packaging layer 600.

As an example, the method for forming the first packaging layer 600 may comprise one of compression molding, transfer molding, liquid sealing molding, vacuum lamination, and spin coating. The material of the first packaging layer 600 may comprise one of polyimide, silica gel, and epoxy resin. After the first packaging layer 600 is formed, the method may further comprise polishing or grinding a top surface of the first packaging layer 600 to provide a flat top surface of the first packaging layer 600.

Figure 9:
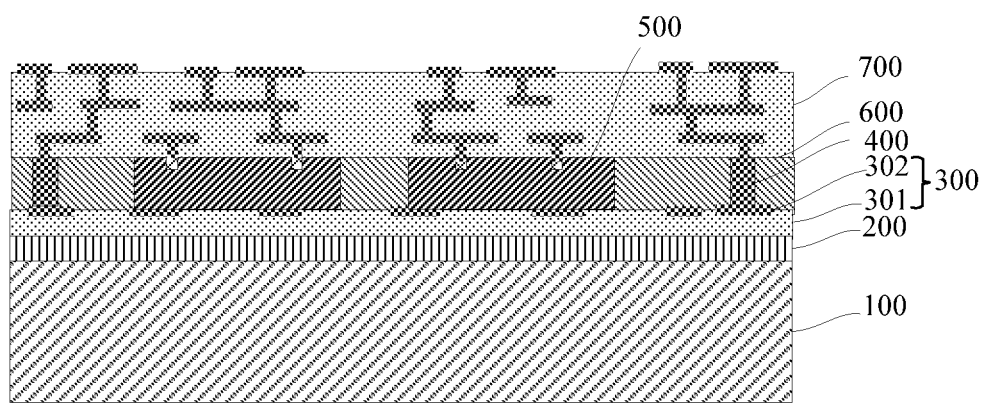

Next, referring to FIG. 9, a second redistribution layer 700 is formed on the first packaging layer 600. The second redistribution layer 700 comprises a first surface in contact with the first packaging layer 600 and a second surface opposite to the first surface, and the conductive channels in the second redistribution layer 700 is electrically connected to the metal connecting posts 400 and the pad of the semiconductor chip 500.

As an example, a thickness of the second redistribution layer 700 is greater than a thickness of the first redistribution layer 300.

As an example, for the material, structure, and preparation of the second redistribution layer 700 are similar to those of the first redistribution layer 300. Details will not be described herein again. In this embodiment, since the second redistribution layer 700 includes relatively more conductive channels placed in a dielectric material, the thickness of the second redistribution layer 700 can be greater than the thickness of the first redistribution layer 300. The specific thicknesses of the first redistribution layer 300 and the second redistribution layer 700 are not excessively limited herein.

Figure 10:
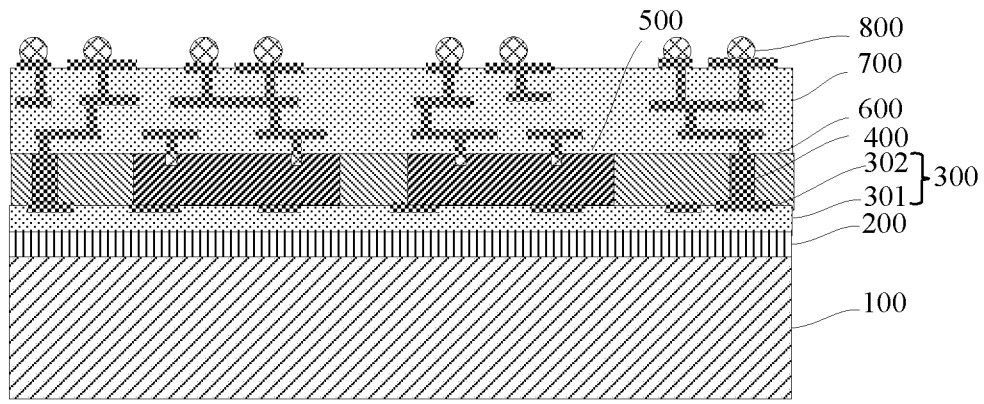

Next, referring to FIG. 10, metal bumps 800 are formed, and the metal bumps 800 is electrically connected to the second redistribution layer 700. The metal bumps 800 may comprise a copper bump, a nickel bump, a tin bump, and a silver bump. The specific type of the metal bumps may be selected as required.

Figure 11:
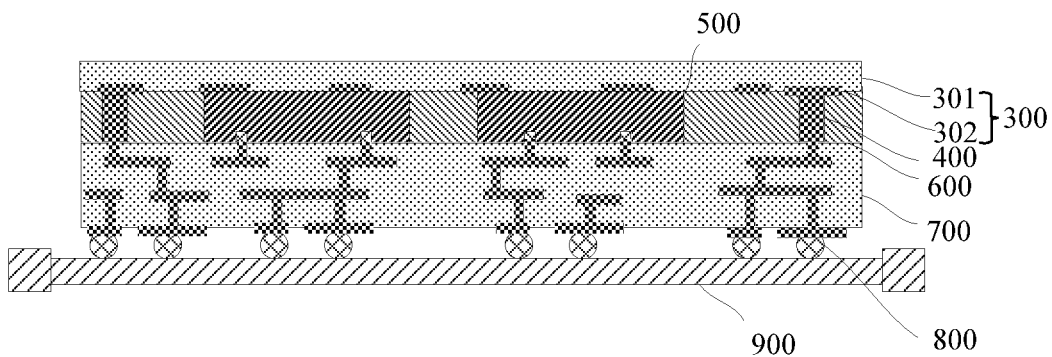

Next, referring to FIG. 11, a carrier 900 is provided, and the support substrate 100 is peeled off to expose the first surface of the first redistribution layer 300. As an example, the separation layer 200 adopts a LTHC layer in some examples, and therefore the support substrate 100 can be heated to be separated from the LTHC layer by a laser. However, the method of peeling off the support substrate 100 is not limited thereto, and may be selected accordingly depending on the materials of the support substrate 100 and the separation layer 200.

Figure 12:
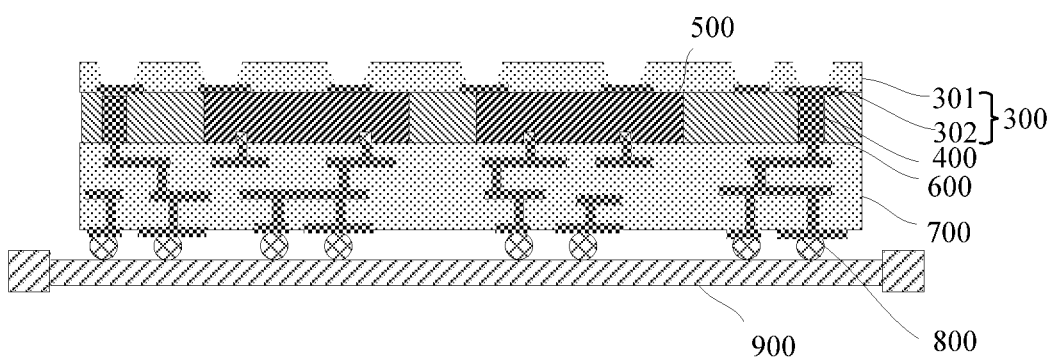

Next, referring to FIG. 12, laser etching is performed on the first redistribution layer 300 to expose the metal distribution layer 302 in the first redistribution layer 300.

Figure 13:
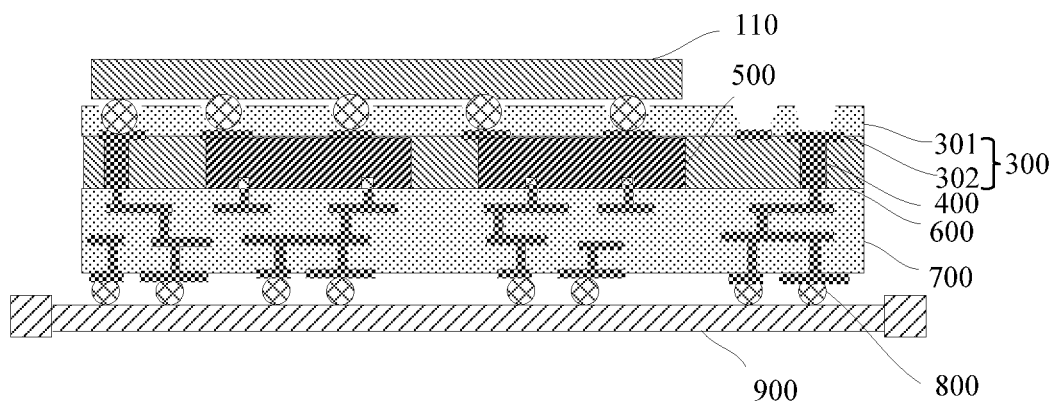
Figure 14:
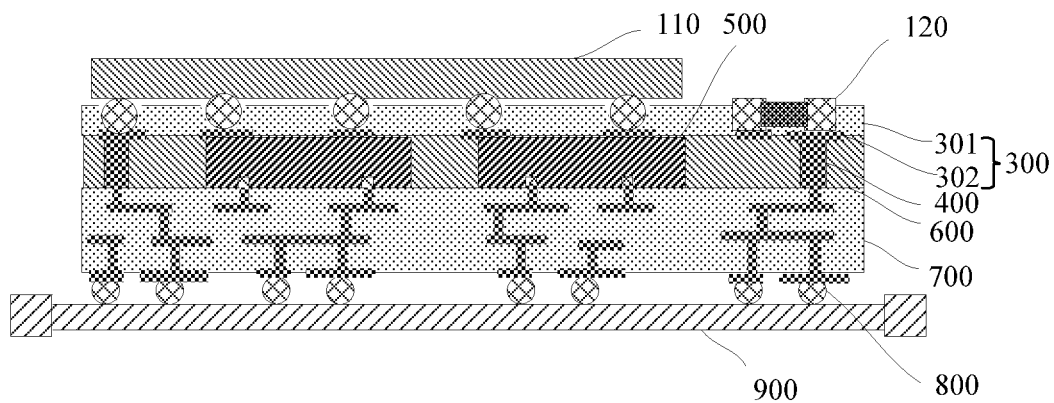

Next, referring to FIG. 13 and FIG. 14, a stacked chip package 110 and a passive element 120 are provided. The stacked chip package 110 and the passive element 120 are disposed on the first surface of the first redistribution layer 300. The stacked chip package 110 and the passive element 120 are both electrically connected to the metal distribution layer 302 exposed from the first redistribution layer 300 respectively via the contact bumps and contact pads.

As an example, the stacked chip package 110 comprises an Embedded Package on Package (ePoP) memory (not shown in the figures).

As an example, the passive element 120 comprises one or more of a resistor, a capacitor, and an inductor.

As an example, in this embodiment, the stacked chip package 110 includes an ePoP memory, but the present disclosure is not limited thereto. Other packages may also be used as desired. Similarly, the passive element 120 may also be disposed as required, which is not excessively limited herein.

Figure 15:
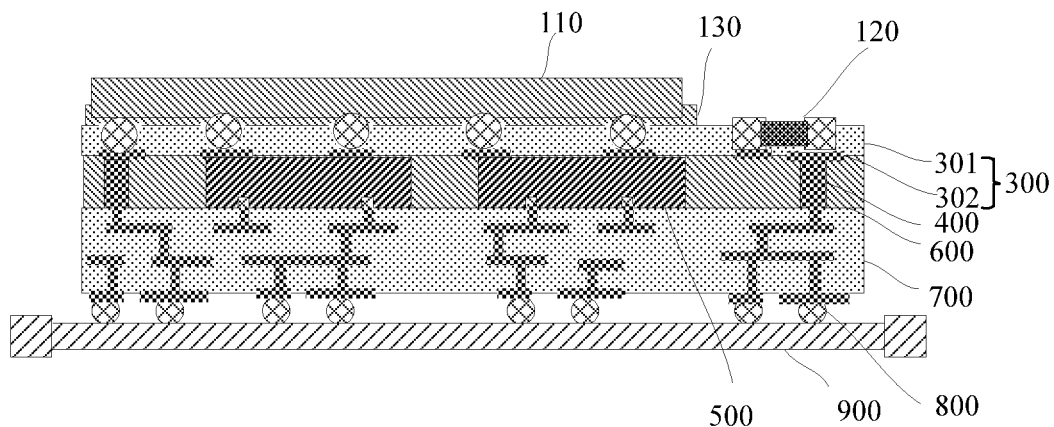

Next, referring to FIG. 15, a gap between the stacked chip package 110, the back side of the semiconductor chip 500 and the first redistribution layer 300 is filled with a filling layer 130.

As an example, the filling layer 130 may comprise one of an epoxy resin layer, a polyimide layer, and a silica gel layer. In this way, the gap can be filled with the insulating filling layer 130 to strengthen the bonding effect between the semiconductor chip 500 and the first redistribution layer 300, so as to form a protective layer, thereby preventing moisture and oxygen from impacting the semiconductor chip 500 and the first redistribution layer 300. The selection of the material of the filling layer 130 is not limited herein.

Figure 16:
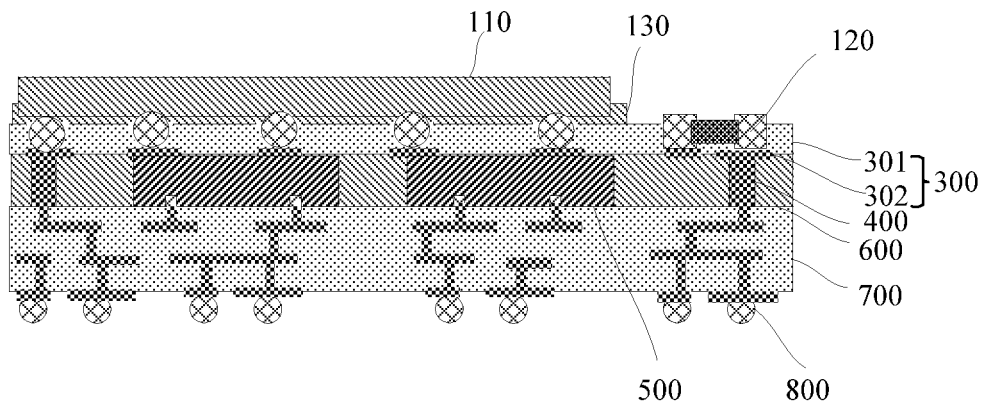

Finally, referring to FIG. 16, cutting is performed to form a fan-out packaging structure.

As an example, after the filling layer 130 is formed and before the cutting is performed, the method further comprises a step of packaging the first redistribution layer 300, the stacked chip package 110, and the passive element 120 by a second packaging layer 140.

Figure 17:
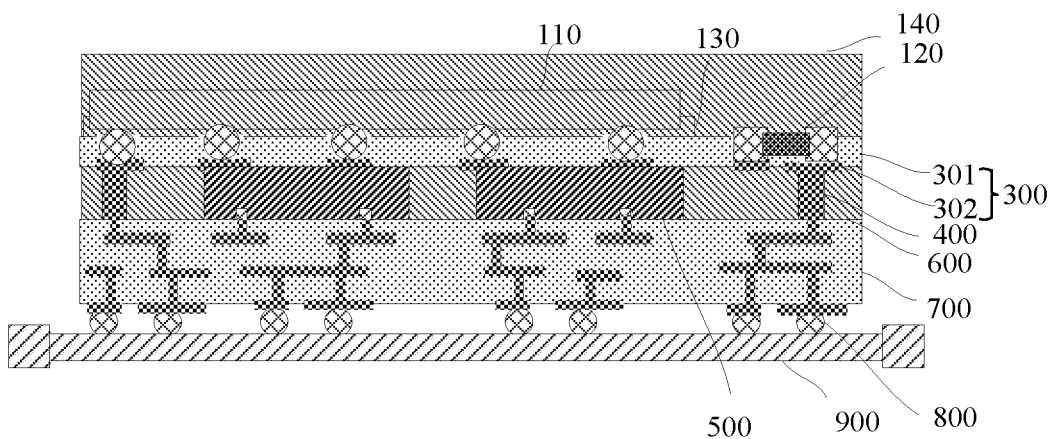
Figure 18:
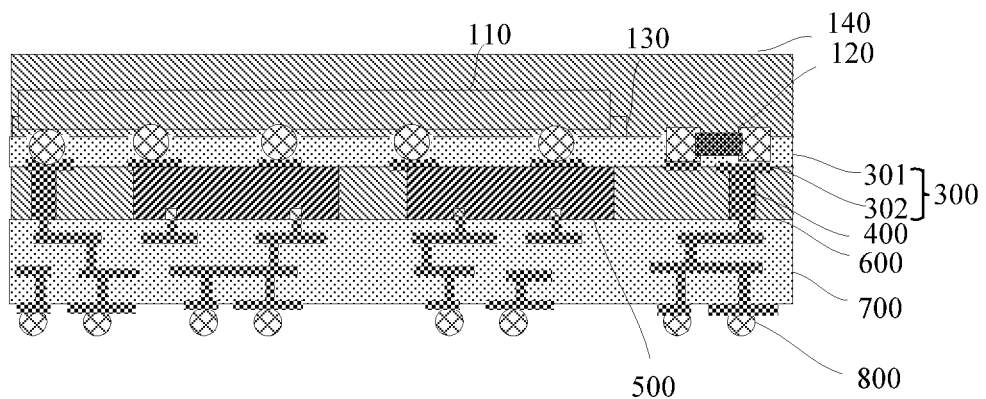

As an example, referring to FIG. 17 and FIG. 18, the second packaging layer 140 comprises one of an epoxy resin layer, a polyimide layer, and a silica gel layer. For the specific preparation method, refer to the first packaging layer 600.

Referring to FIG. 16, this embodiment further provides a fan-out packaging structure. The fan-out packaging structure may be prepared by the foregoing preparation method, but the present disclosure is not limited thereto. In this embodiment, the fan-out packaging structure is prepared by the foregoing preparation method. Details regarding the preparation method and materials of the fan-out packaging structure will not be repeated herein.

As an example, the fan-out packaging structure comprises a first redistribution layer 300, a second redistribution layer 700, metal connecting posts 400, a semiconductor chip 500, a first packaging layer 600, a stacked chip package 110, a passive element 120, a filling layer 130, and metal bumps 800. The first redistribution layer 300 comprises a first surface and a second surface opposite to each other. The second redistribution layer 700 comprises a first surface and a second surface opposite to each other. The metal connecting posts 400 are located between the second surface of the first redistribution layer 300 and the first surface of the second redistribution layer 700, and are electrically connected to the first redistribution layer 300 and the second redistribution layer 700. The semiconductor chip 500 is located between the second surface of the first redistribution layer 300 and the first surface of the second redistribution layer 700. A back side of the semiconductor chip 500 is bonded to the first redistribution layer 300, and a front side of the semiconductor chip 500 is away from the first redistribution layer 300 and electrically connected to the second redistribution layer 700. The first packaging layer 600 is located between the second surface of the first redistribution layer 300 and the first surface of the second redistribution layer 700, and is configured to cover the first redistribution layer 300, the metal connecting posts 400, and the semiconductor chip 500. The stacked chip package 110 and a passive element 120 are located on the first surface of the first redistribution layer 300 and are electrically connected to the first redistribution layer 300. The filling layer 130 is located between the stacked chip package 110 and the first redistribution layer 300 and is configured to fill a gap between the stacked chip package 110 and the first redistribution layer 300. The metal bump 800 is located on the second surface of the second redistribution layer 700 and is electrically connected to the second redistribution layer 700.

As an example, the fan-out packaging structure further comprises a second packaging layer 140 configured to cover the first redistribution layer 300, the stacked chip package 110, and the passive element 120.

As an example, the stacked chip package 110 comprises an ePoP memory.

As an example, the passive element 120 comprises one or more of a resistor, a capacitor, and an inductor.

As an example, a thickness of the second redistribution layer 700 is greater than a thickness of the first redistribution layer 300.

As an example, the first packaging layer 600 comprises one of an epoxy resin layer, a polyimide layer, and a silica gel layer. The filling layer 130 comprises one of the epoxy resin layer, the polyimide layer, and the silica gel layer.

Based on the above description, by means of the fan-out packaging structure and the fan-out packaging method consistent with the present disclosure, various chips having different functions can be integrated into one packaging structure, thereby improving the integration level of the fan-out packaging structure. By means of the first redistribution layer, the second redistribution layer, and the metal connecting posts, three-dimensional vertically stacked packaging is achieved. In this way, the integration level of the packaging structure can be effectively improved, and the conduction paths can be effectively shortened, thereby reducing power consumption, increasing the transmission speed, and increasing the data processing capacity.

The above embodiments only exemplarily illustrate the principles and effects of the present disclosure, but are not used to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method of fabricating a fan-out chip package, the method comprising following steps:

providing a support substrate, and forming a separation layer on the support substrate;

forming a first redistribution layer on the separation layer, wherein the first redistribution layer comprises a first surface in contact with the separation layer and a second surface opposite to the first surface;

forming metal connecting posts on the second surface of the first redistribution layer, wherein the metal connecting posts are electrically connected to the first redistribution layer;

providing a semiconductor chip, wherein the semiconductor chip is disposed on the second surface of the first redistribution layer, wherein a back side of the semiconductor chip is bonded to the first redistribution layer, and a front side of the semiconductor chip is facing away from the second surface of the first redistribution layer;

packaging the first redistribution layer, the metal connecting posts, and the semiconductor chip by a first packaging layer, wherein the metal connecting posts and a pad of the semiconductor chip are configured to be exposed from the first packaging layer;

forming a second redistribution layer on the first packaging layer, wherein the second redistribution layer comprises a first surface in contact with the first packaging layer and a second surface opposite to the first surface, and the second redistribution layer is electrically connected to the metal connecting posts and the pad of the semiconductor chip;

forming metal bumps on the second surface of the second redistribution layer, wherein the metal bumps are electrically connected to the second redistribution layer;

providing a carrier, and peeling off the support substrate to expose the first surface of the first redistribution layer;

performing laser etching on the first redistribution layer to expose a metal distribution layer in the first redistribution layer;

providing a stacked chip package and a passive element, wherein the stacked chip package and the passive element are located on the first surface of the first redistribution layer, wherein the stacked chip package is electrically connected to the metal distribution layer via contact bumps exposed from the first redistribution layer, and wherein the passive element is electrically connected to the metal distribution layer via a contact pad exposed from the first redistribution layer;

filling a gap between the stacked chip package and the first redistribution layer with a filling layer;

packaging the first redistribution layer, the stacked chip package, and the passive element by a second packaging layer;

and performing cutting to form the fan-out chip package structure.

2. The method of fabricating the fan-out chip package as in claim 1, wherein the second packaging layer comprises plastics.

3. The method of fabricating the fan-out chip package as in claim 1, wherein the stacked chip package comprises an Embedded Package on Package ePoP memory.

4. The method of fabricating the fan-out chip package as in claim 1, wherein the passive element comprises one or more of a resistor, a capacitor, and an inductor.

5. A fan-out chip packaging structure, comprising:
a first redistribution layer, comprising a first surface and a second surface opposite to each other;
a second redistribution layer, comprising a first surface and a second surface opposite to each other;
metal connecting posts, disposed between the second surface of the first redistribution layer and the first surface of the second redistribution layer and electrically connected to the first redistribution layer and the second redistribution layer;
a semiconductor chip, disposed between the second surface of the first redistribution layer and the first surface of the second redistribution layer, wherein a back side of the semiconductor chip is bonded to the first redistribution layer, and a front side of the semiconductor chip faces away from the first redistribution layer, and wherein the semiconductor chip is electrically connected to the second redistribution layer;
a first packaging layer, disposed between the second surface of the first redistribution layer and the first surface of the second redistribution layer, and is configured to cover the first redistribution layer, the metal connecting posts, and the semiconductor chip;
a stacked chip package and a passive element, disposed on the first surface of the first redistribution layer, wherein the stacked chip package is electrically connected to the metal distribution layer via contact bumps exposed from the first redistribution layer, and wherein the passive element is electrically connected to the metal distribution layer via a contact pad exposed from the first redistribution layer;
a filling layer, disposed between the stacked chip package and the first redistribution layer and configured to fill a gap between the stacked chip package and the first redistribution layer;
and
metal bumps, disposed on the second surface of the second redistribution layer and electrically connected to the second redistribution layer.

6. The fan-out chip packaging structure as in claim 5, further comprising: a second packaging layer, configured to cover the first redistribution layer, the stacked chip package, and the passive element.

7. The fan-out chip packaging structure as in claim 5, wherein the stacked chip package comprises an ePoP memory.

8. The fan-out chip packaging structure as in claim 5, wherein the passive element comprises one or more of a resistor, a capacitor, and an inductor.

9. The fan-out packaging structure as in claim 5, wherein a thickness of the second redistribution layer is greater than a thickness of the first redistribution layer.

10. The fan-out chip packaging structure as in claim 5, wherein the packaging layer comprises one of an epoxy resin layer, a polyimide layer, and a silica gel layer; and wherein the filling layer comprises one of the epoxy resin layer, the polyimide layer, and the silica gel layer.

* * * * *